US 6,469,769 B2

(12) United States Patent
Ozaki

(10) Patent No.: US 6,469,769 B2
(45) Date of Patent: Oct. 22, 2002

(54) MANUFACTURING METHOD OF A LIQUID CRYSTAL DISPLAY

(75) Inventor: Kiyoshi Ozaki, Yonago (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/876,331

(22) Filed: Jun. 7, 2001

(65) Prior Publication Data
US 2001/0040649 A1 Nov. 15, 2001

Related U.S. Application Data

(63) Continuation of application No. PCT/JP99/07068, filed on Dec. 16, 1999.

(30) Foreign Application Priority Data

Mar. 16, 1999 (JP) .......................................... 11-070153

(51) Int. Cl.⁷ ................................................ G02F 1/13
(52) U.S. Cl. ......................... 349/187; 438/30; 438/180; 349/43
(58) Field of Search ........................... 438/30, 29, 180; 349/187, 43

(56) References Cited

U.S. PATENT DOCUMENTS 5,496,752 A * 3/1996 Nasu et al. .................. 437/41
6,274,400 B1 * 8/2001 Jen ............................. 438/30

FOREIGN PATENT DOCUMENTS

JP   8-062634    3/1996
JP   8-160457    6/1996
JP   10-163499   6/1998

* cited by examiner

Primary Examiner—Kenneth Parker
Assistant Examiner—David Chung
(74) Attorney, Agent, or Firm—Greer, Burns & Crain, Ltd.

(57) ABSTRACT

It is intended to provide a manufacturing method of a liquid crystal display that can reduce the manufacturing cost by decreasing the number of masks. A gate insulating film, a semiconductor film, and a silicon nitride film are laid on a substrate on which a gate bus line is formed, back exposure is performed by using the gate bus line as a mask, and the silicon nitride film is then patterned, whereby a channel protective film is formed along the gate bus line. Two device isolation holes are formed over the gate bus line at two locations that are on both sides of a source electrode and a drain electrode and that are separated from each other in the extending direction of the gate bus line. A thin-film transistor is formed in such a manner that a semiconductor active film is formed by a portion of the semiconductor film that is interposed between the two device isolation holes and is thereby electrically isolated from other pixel regions and that a gate electrode is formed by a portion of the gate bus line that is located between the two device isolation holes.

3 Claims, 18 Drawing Sheets

Fig. 2A
Fig. 2B
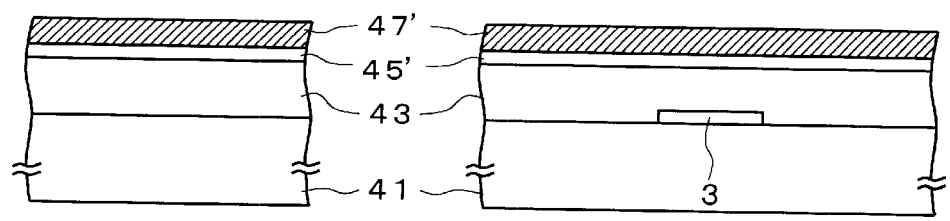
Fig. 2C
Fig. 2D
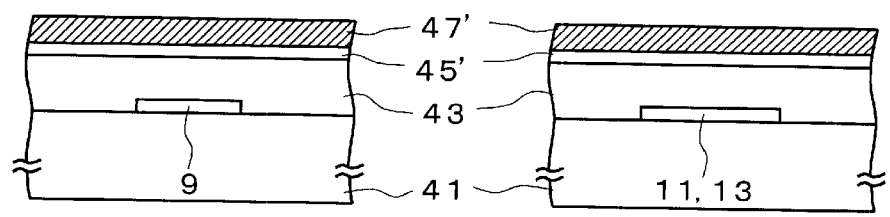
Fig. 2E
Fig. 2F
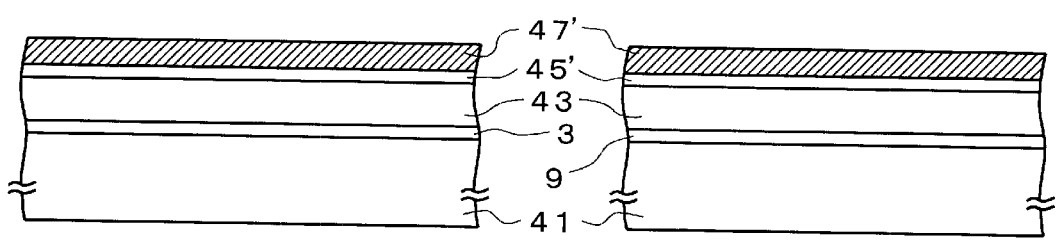

Fig. 4A
Fig. 4B
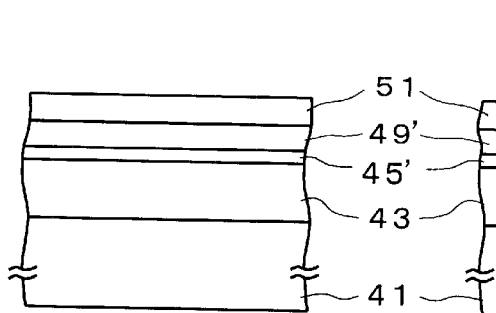
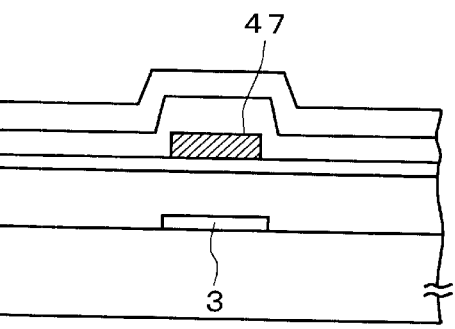
Fig. 4C
Fig. 4D
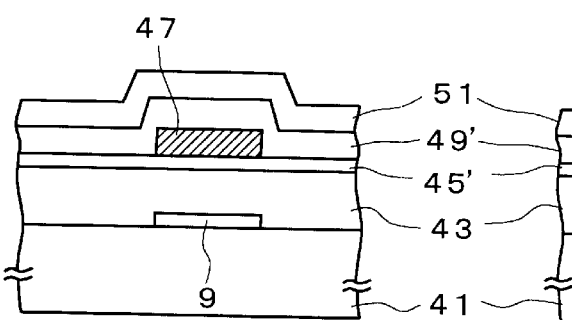
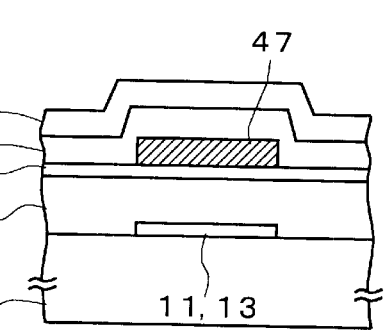
Fig. 4E
Fig. 4F
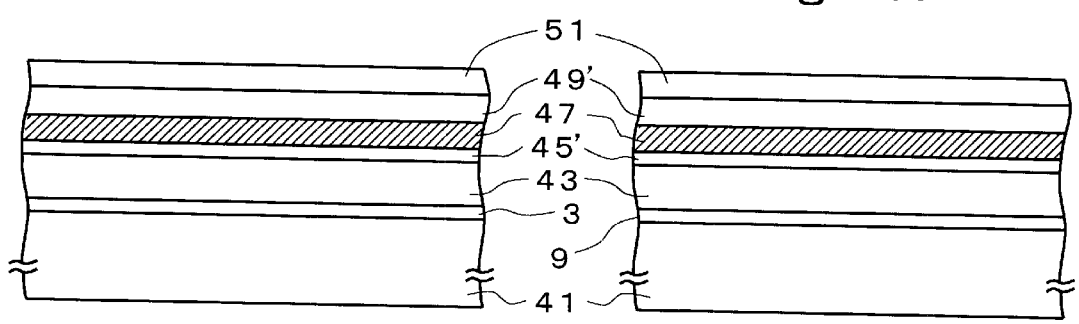

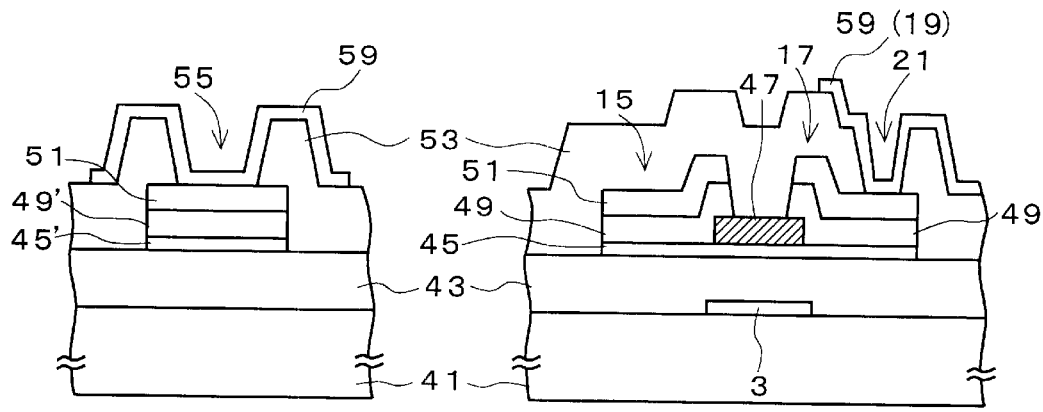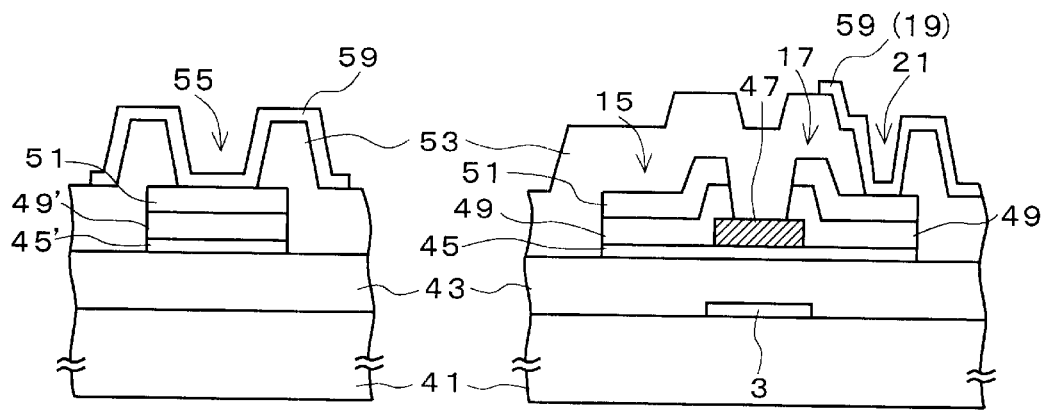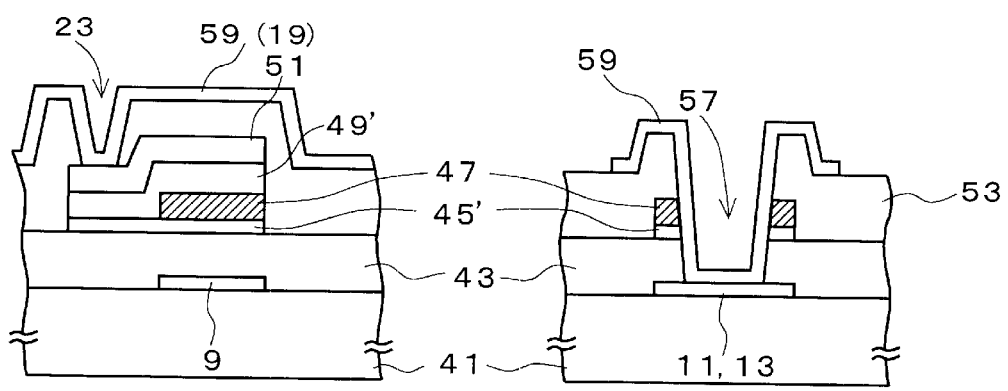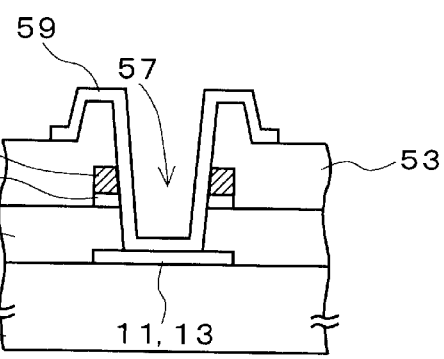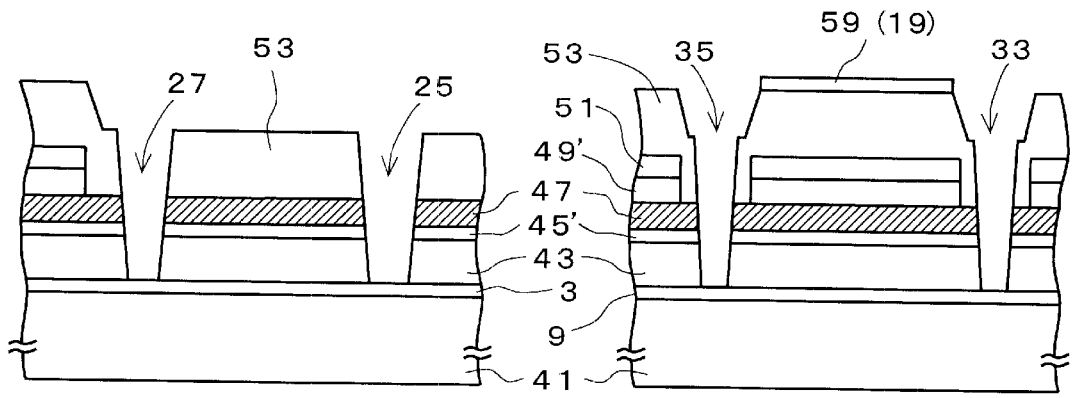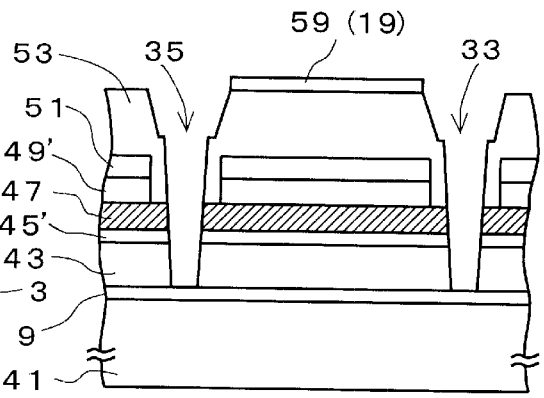

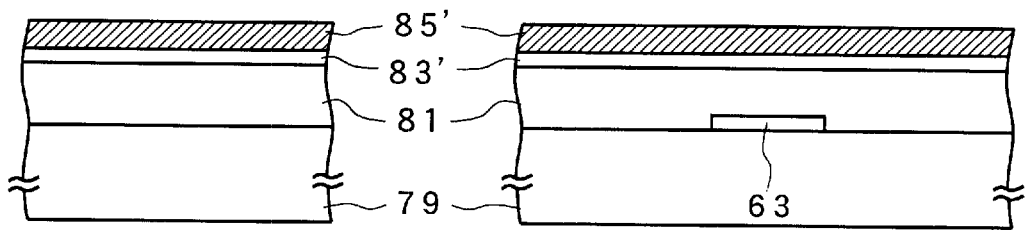
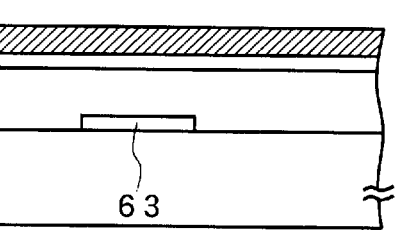
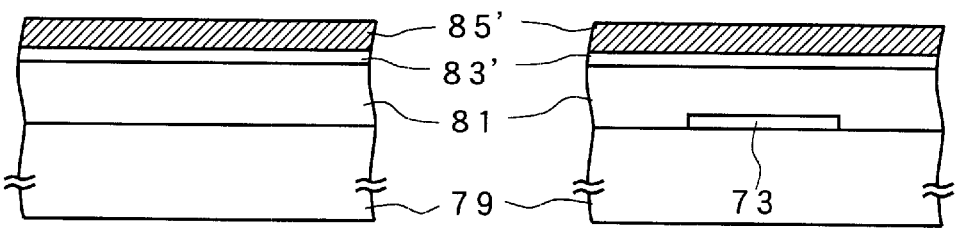
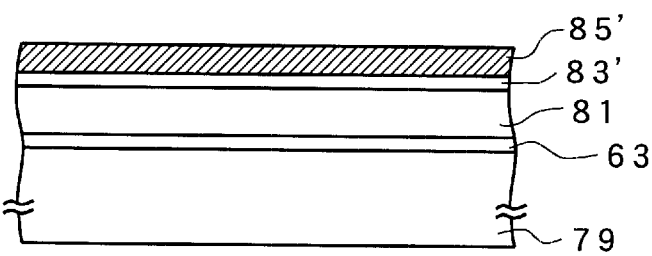

Fig. 10A
Fig. 10B
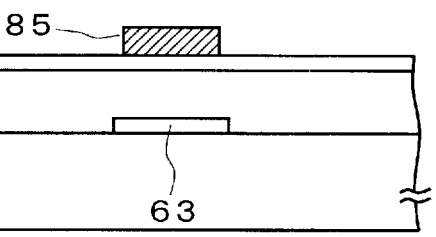
Fig. 10C
Fig. 10D
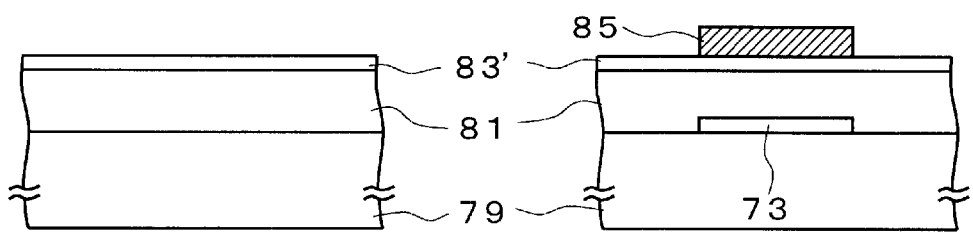
Fig. 10E
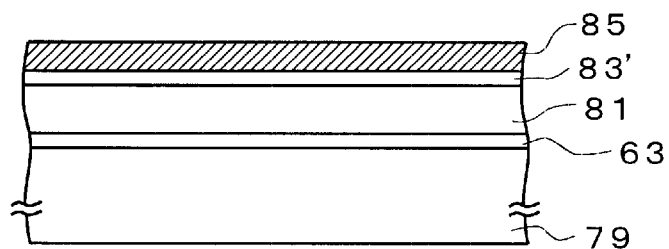

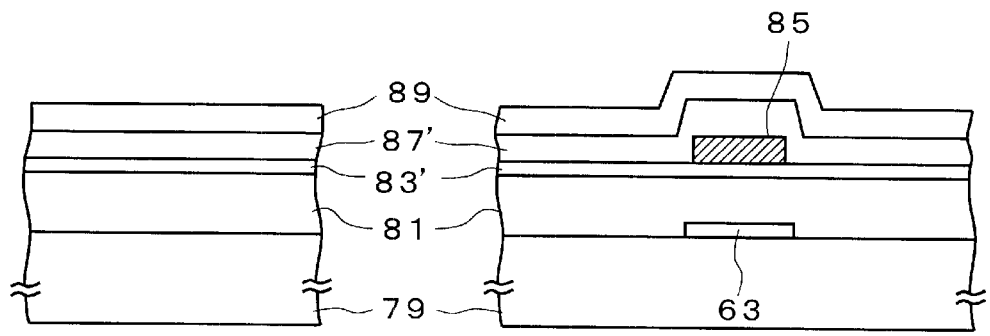
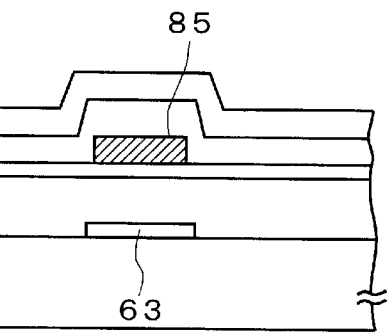
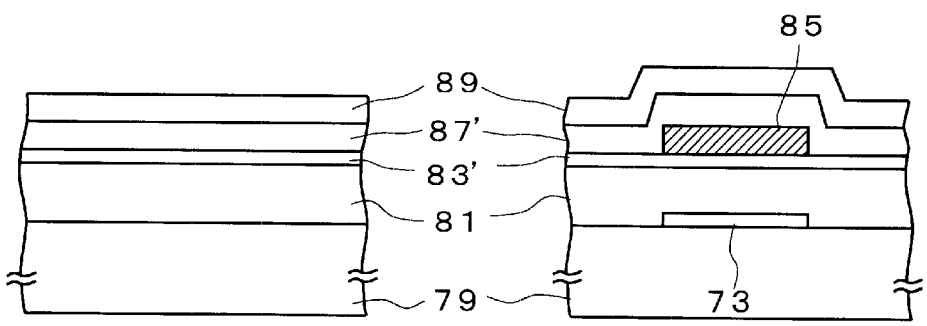
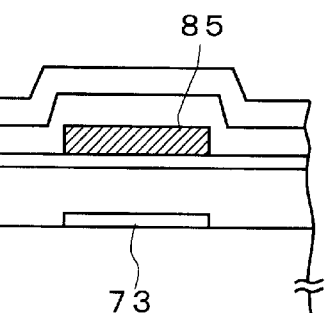
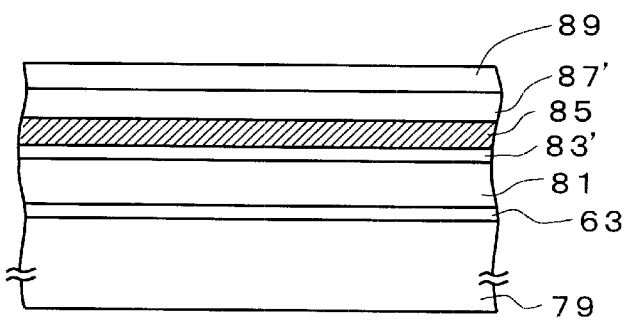

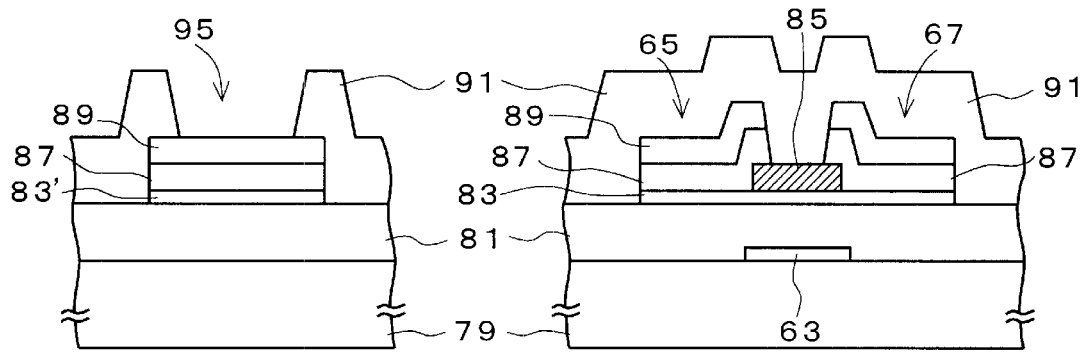
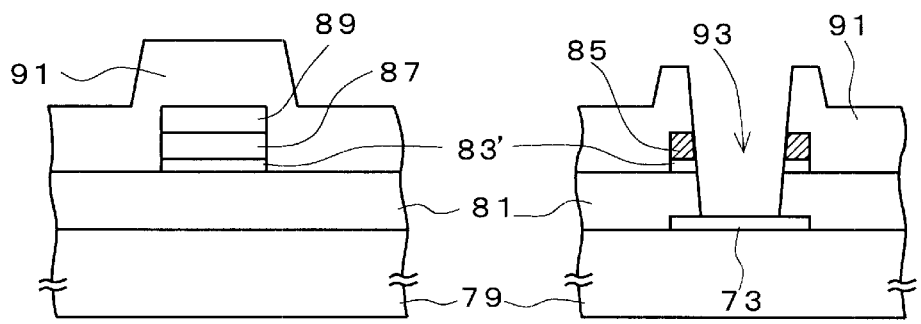
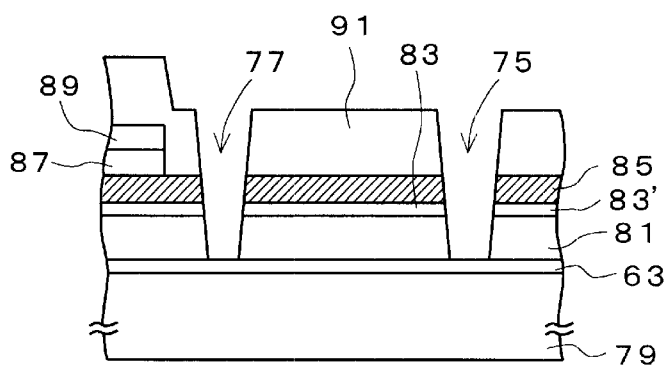

Fig. 18A
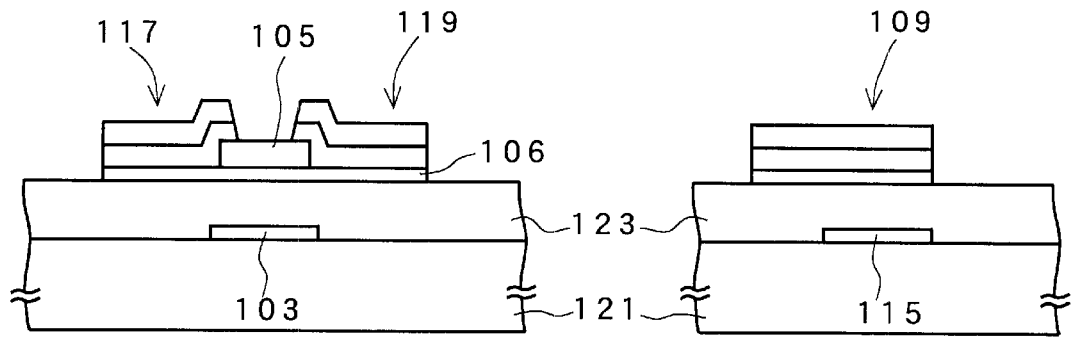
Fig. 18B
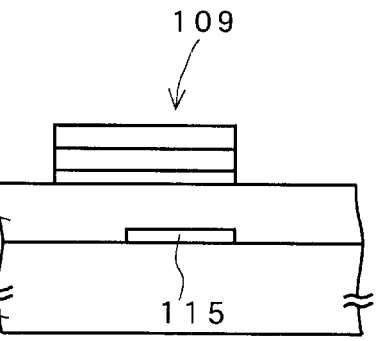
Fig. 19A
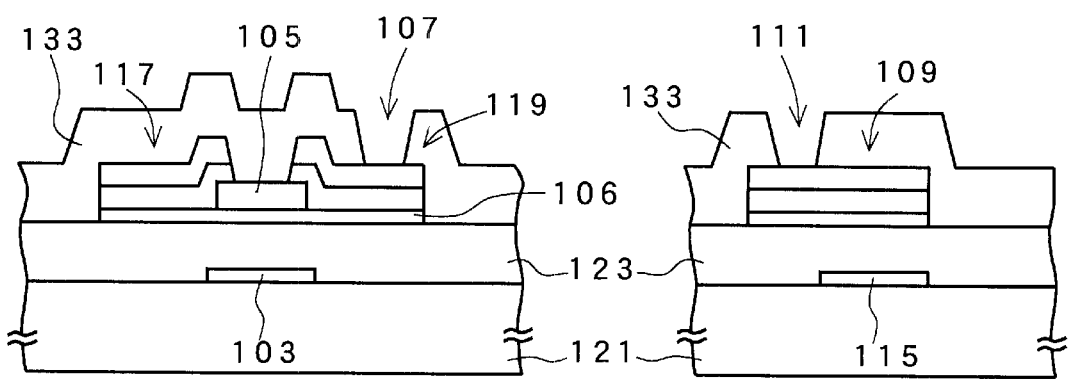
Fig. 19B
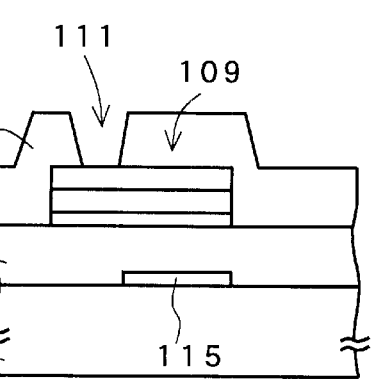
Fig. 20A
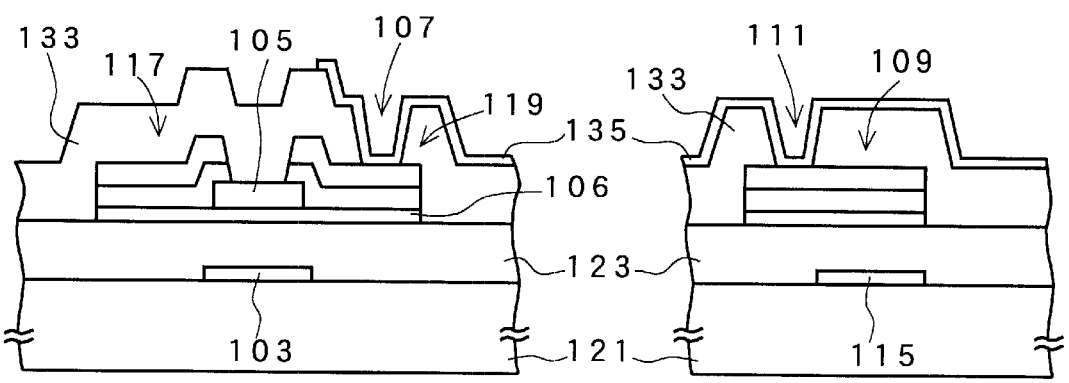
Fig. 20B

MANUFACTURING METHOD OF A LIQUID CRYSTAL DISPLAY

CROSS-REFERENCE TO THE RELATED APPLICATION

This is a continuation of international application No. PCT/JP99/07068, filed Dec. 16, 1999.

BACKGROUND OF THE INVENTION

1. Field of the Invention

The present invention relates to a manufacturing method of a liquid crystal display. In particular, the invention relates to a manufacturing method of an active matrix liquid crystal display having thin-film transistors (hereinafter referred to as TFTs) as switching elements.

2. Description of the Related Art

Active matrix liquid crystal displays that are used as displays of OA equipment including computers are now attracting much attention as high-image-quality flat panel displays. Such active matrix liquid crystal displays are generally classified into the vertical electric field type and the horizontal electric field type. In vertical electric field type liquid crystal display panels, a liquid crystal is sealed between an array substrate in which TFTs and pixel electrodes are formed and an opposite substrate in which a common electrode is formed. When a voltage is applied between electrodes on both sides of the liquid crystal layer, an electric field develops approximately perpendicularly to the substrate surfaces. On the other hand, in horizontal electric field type liquid crystal display panels, not only TFTs and pixel electrodes but also a common electrode is formed in an array substrate. When a voltage is applied between electrodes, an electric field develops in a liquid crystal layer that is sealed between the array substrate and an opposite substrate in a direction approximately parallel with the substrate surfaces.

FIG. 14 is a substrate plan view of an array substrate of a vertical electric field type liquid crystal display panel as viewed from the liquid crystal layer side. As shown in FIG. 14, a plurality of data bus lines (drain bus lines) 101 are formed in the substrate so as to extend in the top-bottom direction in FIG. 14. A plurality of gate bus lines 103 (indicated by broken lines in FIG. 14) are also formed in the substrate so as to extend in the right-left direction in FIG. 14. A pixel is formed in each of regions that are defined by the data bus lines 101 and the gate bus lines 103. A TFT is formed in the vicinity of each of the intersecting points of the data bus lines 101 and the gate bus lines 103. A drain electrode 117 of the TFT shown in FIG. 14 branches off the left-hand data bus line 101 in FIG. 14 and has an end portion that is located over one side portion of a channel protective film 105 that is formed over the gate bus line 103 shown in FIG. 14.

On the other hand, a source electrode 119 is formed so as to overlap with the other side portion of the channel protective film 105. With the above structure, the portion of the gate bus line 103 right under the channel protective film 105 functions as a gate electrode of the TFT. Although not shown in FIG. 14, a gate insulating film is formed on the gate bus line 103 and a semiconductor active layer (semiconductor layer of operation) where a channel is to be formed is formed on the gate insulating film. As described above, in the TFT structure of FIG. 14, the gate electrode does not branch off the gate bus line 103 and, instead, part of the straight gate bus line 103 is used as the gate electrode. An auxiliary capacitor bus line 115 (indicated by broken lines in FIG. 14) is formed so as to extend in the right-left direction and to be located approximately at the center of the pixel region in the topbottom direction. A storage capacitor electrode 109 is formed over the auxiliary capacitor bus line 115 so as to coextend with it in the pixel region with an insulating film interposed in between (the storage capacitor electrodes 109 are formed for the respective pixels). A transparent pixel electrode 113 is formed above the source electrode 119 and the storage capacitor electrode 109. The pixel electrode 113 is electrically connected to the source electrode 119 via a contact hole 107 in a protective film that is formed under the pixel electrode 113. The pixel electrode 113 is also electrically connected to the storage capacitor electrode 109 via a contact hole 111.

Next, a manufacturing method of the liquid crystal display shown in FIG. 14 will be described with reference to FIGS. 15A and 15B to FIGS. 20A and 20B. In FIGS. 15A and 15B to FIGS. 20A and 20B, the same components as shown in FIG. 14 are given the same reference numerals as in FIG. 14. FIGS. 15A, 16A, 17A, 18A, 19A and 20A are sectional views of the TFT taken along line M–M' in FIG. 14, and FIGS. 15B, 16B, 17B, 18B, 19B, and 20B are sectional views of the storage capacitor portion taken along line N–N' in FIG. 14.

First, as shown in FIGS. 15A and 15B, a metal layer of about 150 nm in thickness is formed on a transparent glass substrate 121 by forming an Al (aluminum) film, for example, over the entire surface. Then, patterning is performed by using a first mask, whereby a gate bus line 103 (see FIG. 15A) and an auxiliary capacitor bus line 115 (see FIG. 15B) are formed. Then, a silicon nitride (SiN) film, for example, is formed over the entire substrate surface by plasma CVD, whereby a gate insulating film 123 is formed. Then, an amorphous silicon (a-Si) layer 125, for example, to be used for forming a semiconductor active film is formed over the entire substrate surface by plasma CVD. Further, a SiN film 127, for example, to be used for forming a channel protective film is formed over the entire surface by plasma CVD.

Then, back exposure is performed on the transparent glass substrate 121 with the gate bus line 103 and the auxiliary capacitor bus line 115 as a mask. Further, by using a second mask, a resist pattern (not shown) is formed over the gate bus line 103 in a self-aligned manner, and the portions of the silicon nitride film 127 over the gate bus line 103 and the auxiliary capacitor bus line 115 are etched away, whereby a channel protective film 105 is formed over the gate bus line 103 in the TFT forming region (see FIGS. 16A and 16B).

Then, as shown in FIGS. 17A and 17B, an n$^+$a-Si layer 129 to be used for forming an ohmic contact layer is formed over the entire surface by plasma CVD. Then, a metal (e.g., Cr) layer 131 to be used for forming a drain electrode 117, a source electrode 119, a storage capacitor electrode 109, and a data bus line 101 is formed by sputtering.

Thereafter, as shown in FIGS. 18A and 18B, the metal layer 131, the n$^+$a-Si layer 129, and the amorphous silicon layer 125 are patterned by using a third mask, whereby a data bus line 101 (not shown in FIGS. 18A and 18B), a drain electrode 117, a source electrode 119, a storage capacitor electrode 109, and a semiconductor active layer 106 are formed. In the etching of this patterning, the channel protective film 105 serves as an etching stopper, and hence the amorphous silicon layer 125 under the channel protective film 105 is left without being etched.

Thereafter, as shown in FIGS. 19A and 19B, a protective film 133 (e.g., a silicon nitride film) is formed by plasma CVD. Then, the protective film 133 is patterned by using a fourth mask, whereby contact holes 107 and 111 are formed through the protective film 133 over the source electrode 119 and the storage capacitor electrode 109, respectively.

Subsequently, as shown in FIGS. 20A and 20B, a pixel electrode forming layer 135 made of ITO, for example, is formed over the entire surface of the transparent glass substrate 121. Then, the pixel electrode forming layer 135 is patterned by using a fifth mask, whereby a pixel electrode 113 having a prescribed shape as shown in FIG. 14 is formed. The pixel electrode 113 is electrically connected to the source electrode 119 and the storage capacitor electrode 109 via the contact holes 107 and 111, respectively. A vertical electric field type liquid crystal display as shown in FIG. 14 is completed by executing the above process.

Next, the structure of a horizontal electric field type liquid crystal display will be described with reference to FIGS. 21 and 22. FIG. 21 is a substrate plan view of an array substrate of a horizontal electric field type liquid crystal display panel as viewed from the liquid crystal layer side. Referring to FIG. 21, a plurality of data bus lines 101 (only one data bus line 101 is shown in FIG. 21) are formed in the substrate so as to extend in the top-bottom direction in FIG. 21. A plurality of gate bus lines 103 (only one gate bus line 103 is shown in FIG. 21) are also formed in the substrate so as to extend in the right-left direction in FIG. 21, that is, so as to be perpendicular to the data bus lines 101. Each of regions that are defined by the data bus lines 101 and the gate bus lines 103 is a pixel region. A TFT is formed in the vicinity of each of the intersecting points of the data bus lines 101 and the gate bus lines 103. A drain electrode 117 of the TFT shown in FIG. 21 branches off the data bus line 101 shown in FIG. 21 and has an end portion that is located over one side portion of a channel protective film 105 that is formed over the gate bus line 103 shown in FIG. 21. One end portion of a pixel electrode 141 that also serves as a source electrode overlaps with the other side portion of the channel protective film 105 and is opposed to the drain electrode 117. With the above structure, the portion of the gate bus line 103 right under the channel protective film 105 functions as a gate electrode of the TFT. Although not shown in FIG. 21, a gate insulating film is formed on the gate bus line 103 and a semiconductor active layer where a channel is to be formed is formed between the gate insulating film and the overlying channel protective film 105.

In the TFT structure of FIG. 21, the gate electrode does not branch off the gate bus line 103 and, instead, part of the straight gate bus line 103 is used as the gate electrode. The pixel electrode 141 that also serves as the source electrode has a comb structure whose teeth extend downward in FIG. 21 from the base. In the pixel region of the substrate, an opposite electrode 143 is formed that has a comb structure whose teeth extend upward in FIG. 21 from the base and interdigitate with the teeth of the pixel electrode 141.

FIG. 22 is a schematic sectional view of the horizontal electric field type liquid crystal display panel taken along line P–P' in FIG. 21. A liquid crystal layer 155 is sealed between a transparent glass substrate 147 that constitutes an array substrate and a transparent glass substrate 163 that is opposed to the substrate 147 with a prescribed cell gap. In the array substrate, a polarizer 145, the transparent glass substrate 147, an undercoat insulating film 149, the pixel electrodes 141 and the opposed electrodes 143, the protective film 151, and an alignment film 153 are formed in this order from the light incidence side. On the other hand, in the opposite substrate, a polarizer 165, the transparent glass substrate 163, color filters 161, and an alignment film 159 are formed in this order from the light exit side.

The manufacturing method of this horizontal electric field type liquid crystal display panel is almost the same as that of the vertical electric field type liquid crystal display panel. However, there is a difference that in the horizontal electric field type the data bus lines 101, the drain electrodes 117, the pixel electrodes 141 that also serve as the source electrodes, and the opposite electrodes 143 can be formed by patterning using a single mask. Therefore, in contrast to the fact that five masks are necessary to manufacture the array substrate of the vertical electric field type liquid crystal display panel as described above with reference to FIGS. 15A and 15B to FIGS. 20A and 20B, the array substrate of the horizontal electric field type liquid crystal display panel can be manufactured by using four masks.

Incidentally, with the spread of active matrix liquid crystal displays, reduction of the manufacturing cost is an important subject that should be attained to supply liquid crystal displays at a low price in a stable manner. To reduce the manufacturing cost, first, increase of the production yield of liquid crystal display products is required strongly. Second, it is also necessary to increase the throughput of the manufacture of liquid crystal display products. To these ends, not only should the manufacturing process be simplified but also film forming processes and photolithography processes that are more sophisticated than the conventional ones need to be provided. However, there is a problem that introduction of higher-performance manufacturing equipment may increase the manufacturing cost. Further, in view of the recent increase in the resolutions of liquid crystal displays and the recent demand for large-size screens, the current manufacturing methods cannot increase the production yield and the throughput to a great extent. Still further, in the manufacture of a liquid crystal display, the manufacture of masks to be used in photolithography processes are costlier than in the manufacture of a semiconductor device. This is a factor of increasing the manufacturing cost. However, there is a problem that manufacturers are obliged to overlook this point with priority given to increase of the resolution of a liquid crystal display and increase of its screen size.

SUMMARY OF THE INVENTION

An object of the present invention is to provide a manufacturing method of a liquid crystal display that can reduce the manufacturing cost.

The above object is attained by a manufacturing method of a liquid crystal display, comprising the steps of:

forming a gate insulating film, a semiconductor film, and a first insulating film in this order on a substrate and gate bus lines that are formed on the substrate; forming channel protective films extending along the respective gate bus lines by performing back exposure using the gate bus lines as a mask and then patterning the first insulating film; forming, for each pixel region, on the associated channel protective film, a source electrode and a drain electrode that are opposed to each other; and forming, by etching away at least the associated channel protective film and the semiconductor film, two device isolation holes over the associated gate bus line at two locations that are on both sides of the source electrode and the drain electrode.

BRIEF DESCRIPTION OF THE DRAWINGS

FIGS. 2A–2F to 7A–7F show first to sixth stages, respectively, of the liquid crystal display manufacturing method according to the first embodiment of the invention in which FIGS. 2A, 3A, 4A, 5A, 6A and 7A are substrate sectional views taken along line A–A' in FIG. 1, FIGS. 2B, 3B, 4B, 5B, 6B, and 7B are substrate sectional views taken along line B–B' in FIG. 1, FIGS. 2C, 3C, 4C, 5C, 6C, and 7C are substrate sectional views taken along line C–C' in FIG. 1, FIGS. 2D, 3D, 4D, 5D, 6D, and 7D are substrate sectional views taken along line D–D' and E–E' in FIG. 1, FIGS. 2E, 3E, 4E, 5E, 6E, and 7E are substrate sectional views taken along line F–F' in FIG. 1, and FIGS. 2F, 3F, 4F, 5F, 6F, and 7F are substrate sectional views taken along line G–G' in FIG. 1;

FIGS. 9A–9E to 13A–13E show first to fifth stages, respectively, of the liquid crystal display manufacturing method according to the second embodiment of the invention in which FIGS. 9A, 10A, 11A, 12A, and 13A are substrate sectional views taken along line K–K' in FIG. 8, FIGS. 9B, 10B, 11B, 12B, and 13B are substrate sectional views taken along line H–H' in FIG. 8, FIGS. 9C, 10C, 11C, 12C, and 13C are substrate sectional views taken along line I–I' in FIG. 8, FIGS. 9D, 10D, 11D, 12D, and 13D are substrate sectional views taken along line J–J' in FIG. 8, and FIGS. 9E, 10E, 11E, 12E, and 13E are substrate sectional views taken along line L–L' in FIG. 8;

FIGS. 15A and 15B to FIGS. 20A and 20B show first to sixth stages, respectively, of a manufacturing method of the conventional vertical electric field type liquid crystal display panel of FIG. 14 in which FIGS. 15A, 16A, 17A, 18A, 19A, and 20A are substrate sectional views taken along line M–M' in FIG. 14 and FIGS. 15B, 16B, 17B, 18B, 19B, and 20B are substrate sectional views taken along line N–N' in FIG. 14;

DESCRIPTION OF THE PREFERRED EMBODIMENTS

Figure 1:
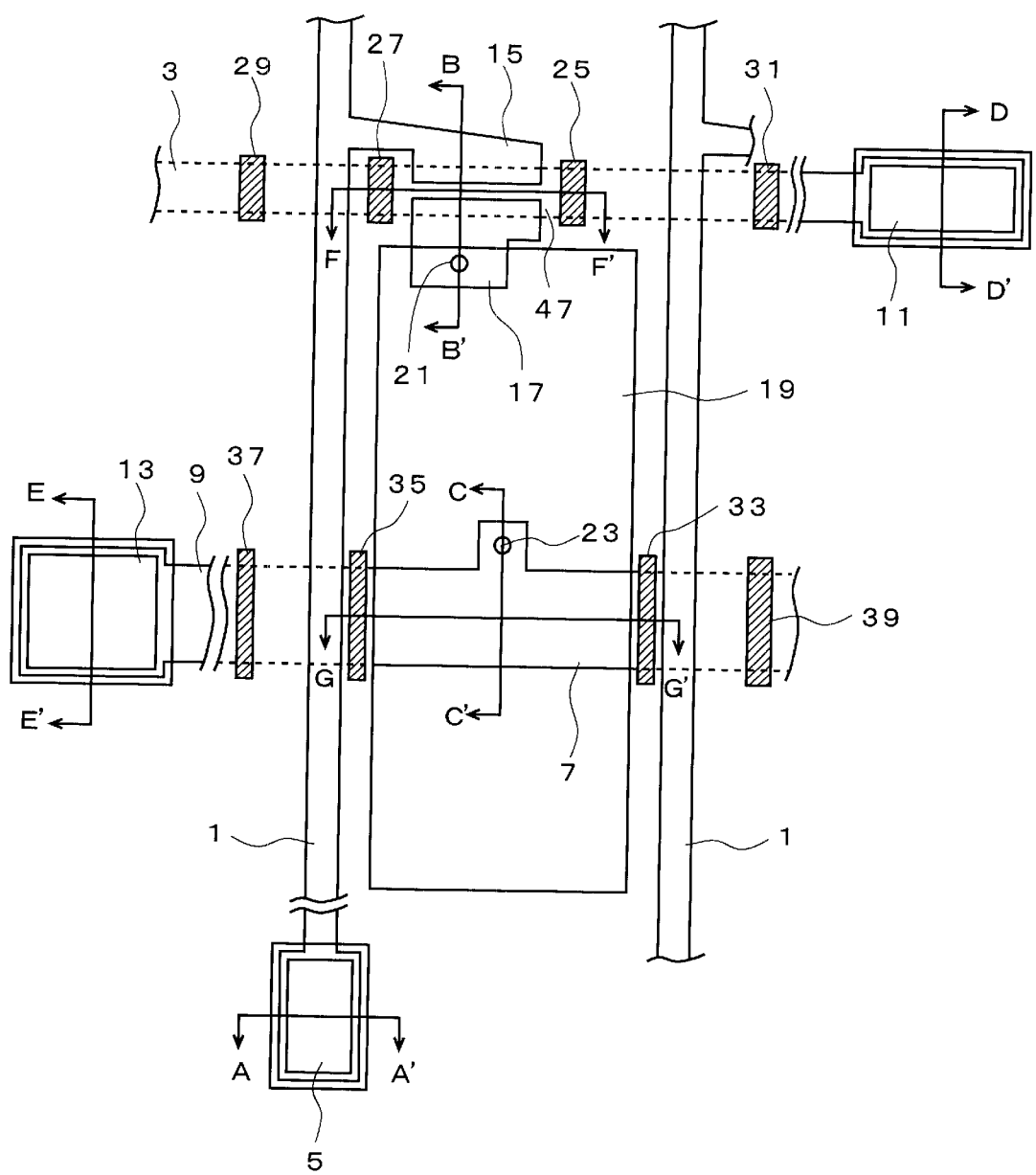
FIG. 1 is a plan view of an array substrate of a vertical electric field type liquid crystal display panel manufactured by a liquid crystal display manufacturing method according to a first embodiment of the present invention.
Figures 3A, 3B:
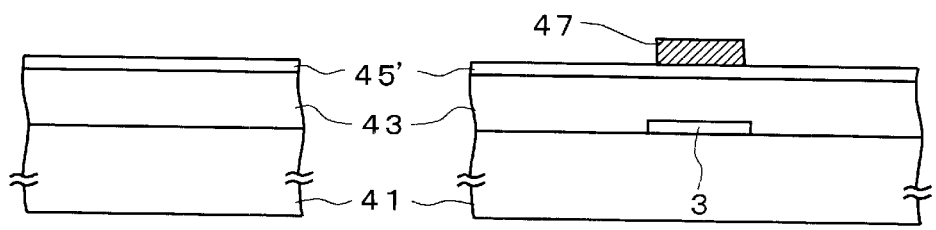
Figures 3C, 3D:
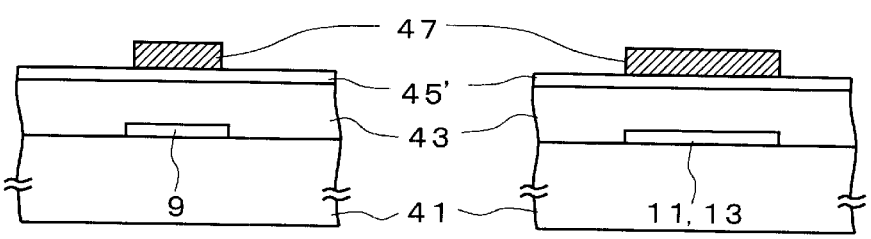
Figures 3E, 3F:
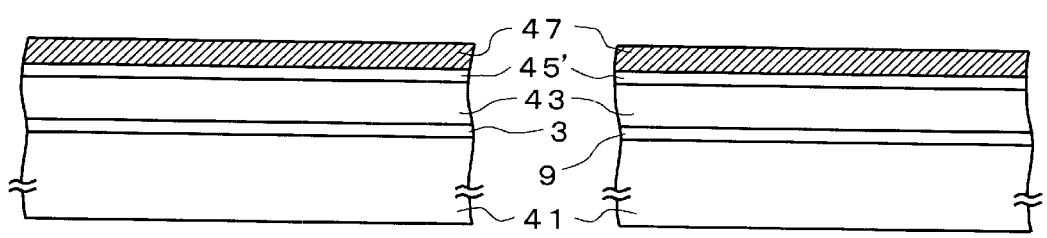

A manufacturing method of a liquid crystal display according to a first embodiment of the present invention will be hereinafter described with reference to FIGS. 1 to 7A–7F. This embodiment is directed to a manufacturing method of a vertical electric field type liquid crystal display panel. First, a general structure of a vertical electric field type liquid crystal display panel manufactured according to this embodiment will be described with reference to FIG. 1. FIG. 1 is a substrate plan view of an array substrate of a vertical electric field type liquid crystal display panel as viewed from the liquid crystal layer side. FIG. 1 shows a pixel region and respective terminal portions of a gate bus line, a data bus line, and an auxiliary capacitor bus line (their intermediate portions are omitted).

Referring to FIG. 1, a plurality of data bus lines 1 (only two data bus lines 1 are shown in FIG. 1) are formed in the substrate so as to extend in the top-bottom direction in FIG. 1. A plurality of gate bus lines 3 indicated by broken lines (only one gate bus line 3 is shown in FIG. 1) are also formed in the substrate so as to extend in the right-left direction in FIG. 1, that is, so as to be perpendicular to the data bus lines 1. Each of regions that are defined by the data bus lines 1 and the gate bus lines 3 is a pixel region. A TFT is formed in the vicinity of each of the intersecting points of the data bus lines 1 and the gate bus lines 3. A drain electrode 15 of the TFT shown in FIG. 1 branches off the left-hand data bus line 1 in FIG. 1 and has an end portion that is located over one side portion of a channel protective film 47 that is formed over the gate bus line 3 shown in FIG. 1. The channel protective film 47 is separated the other regions by two device isolation holes 25 and 27 that are formed over the gate bus line 3 on both sides of the drain electrode 15. A source electrode 17 overlaps with the other side portion of the channel protective film 47 and is opposed to the drain electrode 15. With the above structure, the portion of the gate bus line 3 right under the channel protective film 47 functions as a gate electrode of the TFT. Although not shown in FIG. 1, a gate insulating film is formed on the gate bus line 3 and a semiconductor active layer where a channel is to be formed is formed between the gate insulating film and the overlying channel protective film 47.

Each of the two device isolation holes 25 and 27 is a slit-like opening that has such a length as to traverse the gate bus line 3 completely and such a depth that the gate bus line 3 is exposed as the bottom of the opening. Therefore, although the semiconductor layer is formed over and along the gate bus line 3, the semiconductor active layer that is defined by the two device isolation holes 25 and 27 is electrically isolated from the semiconductor active layers of the TFTs of the adjacent pixels. In the TFT structure of FIG. 1, the gate electrode does not branch off the gate bus line 3 and, instead, part of the straight gate bus line 3 is used as the gate electrode.

An auxiliary capacitor bus line 9 (indicated by broken lines in FIG. 1) is formed so as to extend in the right-left direction and to be located approximately at the center of the pixel region in the top-bottom direction. A storage capacitor electrode 7 is formed over the auxiliary capacitor bus line 9 so as to coextend with it in the pixel region with an insulating film (not shown) interposed in between. A semiconductor layer (not shown) is formed along the auxiliary capacitor bus line 9 between the storage capacitor electrode 7 and the insulating film that is formed on the auxiliary capacitor bus line 9. The semiconductor layer is defined by device isolation holes 33 and 35 that are formed between a pixel electrode 19 and the data bus lines 1, and is electrically isolated from storage capacitor portions (not shown) of the adjacent pixels. Each of the two device isolation holes 33 and 35 is a slit-like opening that has such a length as to traverse the auxiliary capacitor bus line 9 completely and such a depth that the auxiliary capacitor bus line 9 is exposed as the bottom of the opening. Therefore, a storage capacitor portion having the semiconductor layer that is defined by the two device isolation holes 33 and 35 is electrically isolated from the storage capacitor portions of the adjacent pixels.

The pixel electrode 19 that is a transparent electrode is formed above the source electrode 17 and the storage capacitor electrode 7. The pixel electrode 19 is electrically connected to the source electrode 17 via a contact hole 21 in a protective film (not shown) that is formed under the pixel electrode 19. The pixel electrode 19 is also electrically connected to the storage capacitor electrode 7 via a contact hole 23.

A data bus line terminal 5 for electrical connection to an external device is provided at one end of the data bus line 1. Similarly, a gate bus line terminal 11 is provided at one end of the gate bus line 3. Further, an auxiliary capacitor bus line terminal 13 for electrical connection to the outside is provided at one end of the auxiliary capacitor bus line 9. A device isolation hole 31 that is a slit-like opening that has such a length as to traverse the gate bus line 3 completely and such a depth that the gate bus line 3 is exposed as the bottom of the opening is formed in the vicinity of the gate bus line terminal 11. The device isolation hole 31 cuts the semiconductor layer that is formed along the gate bus line 3 and thereby electrically isolates the semiconductor layer of the terminal 11 and the semiconductor active layer of the TFT of the pixel adjacent to the terminal 11. A device isolation hole 37 that is a slit-like opening that has such a length as to traverse the auxiliary capacitor bus line 9 and such a depth that the auxiliary capacitor bus line 9 is exposed as the bottom of the opening is formed in the vicinity of the auxiliary capacitor bus line terminal 13. The device isolation hole 37 cuts the semiconductor layer that is formed along the auxiliary capacitor bus line 9 and thereby electrically isolates the semiconductor layer of the terminal 13 from the semiconductor layer of the storage capacitor portion of the pixel adjacent to the terminal 13.

Next, a manufacturing method of the liquid crystal display shown in FIG. 1 will be described with reference to FIGS. 2A–2F to 7A–7F. In FIGS. 2A–2F to 7A–7F, the components having the same components in FIG. 1 are given the same reference numerals as the latter. FIGS. 2A, 3A, 4A, 5A, 6A, and 7A are sectional views of the data bus line terminal 5 taken along line A–A' in FIG. 1. FIGS. 2B, 3B, 4B, 5B, 6B, and 7B are sectional views of the TFT taken along line B–B' in FIG. 1. FIGS. 2C, 3C, 4C, 5C, 6C, and 7C are sectional views of the storage capacitance portion taken along line C–C' in FIG. 1. FIGS. 2D, 3D, 4D, 5D, 6D, and 7D are sectional views of the gate bus line terminal 11 and the auxiliary capacitance bus line terminal 13 taken along line D–D' or E–E' in FIG. 1. Since the terminals 11 and 13 have the same lamination structure, they are shown by the single figures. FIGS. 2E, 3E, 4E, 5E, 6E, and 7E are sectional views of the TFT taken along line F–F' in FIG. 1 that is parallel with the gate bus line 3. FIGS. 2F, 3F, 4F, 5F, 6F, and 7F are sectional views of the storage capacitor portion taken along line G–G' in FIG. 1 that is parallel with the auxiliary capacitor bus line 9.

As shown in FIGS. 2A–2F, a metal layer of about 150 nm in thickness is formed on a transparent glass substrate 41 by sputtering Al (aluminum) and Ti (titanium), for example, in this order over the entire surface. Then, patterning is performed by using a first mask (a photomask or a reticle (hereinafter referred to as "mask")), whereby a gate bus line 3 (see FIGS. 2B and 2E) and an auxiliary capacitor bus line 9 (see FIGS. 2C and 2F) as well as a gate bus line terminal 11 and an auxiliary capacitor bus line terminal 13 (see FIG. 2D) are formed. Then, a silicon nitride (SiN) film, for example, is formed over the entire substrate surface at a thickness of about 400 nm by plasma CVD, whereby a gate insulating film 43 (may serve as an interlayer insulating film at certain locations; hereinafter referred to as "gate insulating film" or "insulating film" depending on the location of formation) is formed. Then, an amorphous silicon (a-Si) layer 45', for example, to be used for forming a semiconductor active film 45 is formed over the entire substrate surface at a thickness of about 15 nm by plasma CVD. Further, a SiN film 47', for example, to be used for forming a channel protective film 47 is formed over the entire surface at a thickness of about 120 nm by plasma CVD.

Then, after a photoresist (not shown) is applied to the entire surface by spin coating or the like, back exposure is performed on the transparent glass substrate 41 with the gate bus line 3 and the auxiliary capacitor bus line 9 used as a mask. The portions of the resist layer in exposed regions are dissolved, whereby resist patterns (not shown) are formed over the gate bus line 3 and the auxiliary capacitor bus line 9 as well as the gate bus line terminal 11 and the auxiliary capacitor bus line terminal 13 in a self-aligned manner. Dry etching is performed on the silicon nitride film 47' by using the resist patterns as an etching mask, whereby a channel protective film 47 (may serve as an interlayer insulating film at certain locations; hereinafter referred to as "channel protective film" or "silicon nitride film") is formed (see FIGS. 3A–3F).

As shown in FIGS. 3A–3F, the channel protective film 47 is formed on the gate bus line 3 and the auxiliary capacitor bus line 9 as well as the gate bus line terminal 11 and the auxiliary capacitor bus line terminal 13. At this stage, the amorphous silicon layer 45' to be used for forming a semiconductor active layer 45 exists over the entire substrate surface.

Then, as shown in FIGS. 4A–4F, an n$^+$a-Si layer 49', for example, to be used for forming an ohmic contact layer 49 is formed over the entire surface of the transparent glass substrate 41 at a thickness of about 30 nm by plasma CVD. Then, a metal (e.g., Cr) layer 51 to be used for forming a drain electrode 15, a source electrode 17, a storage capacitor electrode 7, and a data bus line 1 is formed at a thickness of about 170 nm by sputtering. Examples of the material of the metal layer 51 other than chromium are molybdenum (Mo), tantalum (Ta), titanium (Ti), and aluminum (Al). As a further alternative, the metal layer 51 may be a composite film of those materials, a Ti/Al/Ti composite film, or the like.

Thereafter, a photoresist layer (not shown) is formed over the entire substrate surface and then patterned by exposing it through a second mask and developing it. Etching is performed on the metal layer 51, the n$^+$a-Si layer 49', and the amorphous silicon layer 45' by using the patterned resist layer as an etching mask (not shown), whereby a data bus line 1, a data bus line terminal 5, a drain electrode 15, a source electrode 17, a storage capacitor electrode 7, a contact layer 49, and a semiconductor active layer 45 are formed as shown in FIGS. 5A–5F. Since the channel protective film 47 serves as an etching stopper in this etching process, the amorphous silicon layer 45' under the channel protective film 47 is left without being etched and a desired semiconductor active layer 45 is formed.

Figure 5A:
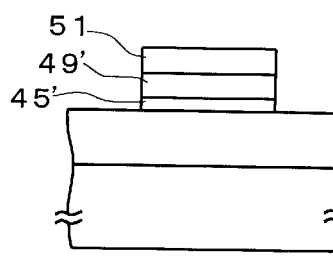
Figure 5B:
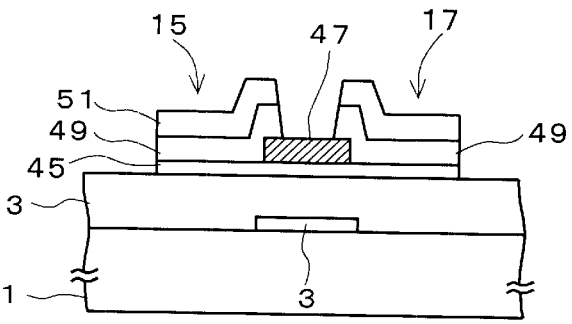
Figure 5C:
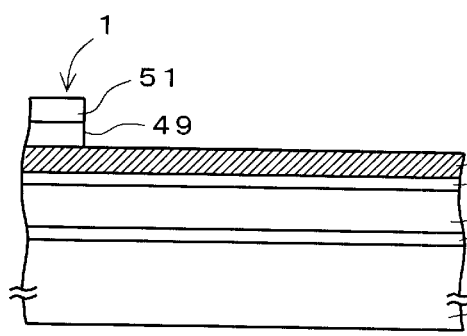

As a result of the execution of the above steps, a structure in which the amorphous silicon layer 45', the n$^+$a-Si layer 49', and the metal layer 51 are laid in this order is formed as the data bus line terminal 5 as shown in FIG. 5A. As shown in FIGS. 5B and 5E, the semiconductor active layer 45 is formed over the gate bus line 3 with the gate insulating film 43 interposed in between and an original TFT structure having the channel protective film 47, the drain electrode 15, and the source electrode 17 is formed on the semiconductor active layer 45. Each of the drain electrode 15 and the source electrode 17 is formed as a structure in which the metal layer 51 is laid on the contact layer 49. As shown in FIGS. 5C and 5F, the amorphous silicon layer 45' is formed on the auxiliary capacitor bus line 9 with the insulating film 43 interposed in between and the storage capacitor electrode 7 in which the metal layer 51 is laid on the n$^+$a-Si layer 49' in this order is formed on the amorphous silicon layer 45' with the silicon nitride film 47 (same as the channel protective film) interposed in between. The storage capacitor electrode 7 is partially wider than the silicon nitride film 47 and a contact hole 23 will be formed later in the wide portion of the storage capacitor electrode 7. As shown in FIG. 5F, the storage capacitor electrode 7 consisting of the n$^+$a-Si layer 49' and the metal electrode 51 is formed on the silicon nitride film 47 in the pixel region that is located between the adjacent data bus lines 1.

Figure 5D:
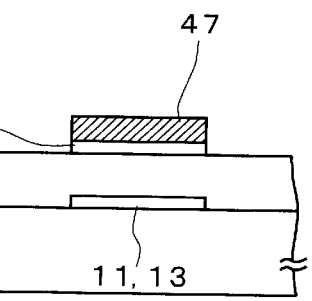
Figures 5E, 5F:
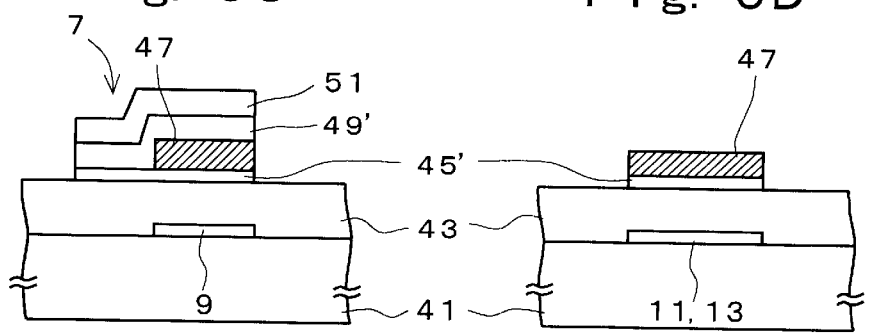

Further, as shown in FIG. 5D, a structure in which the silicon nitride film 47 is laid on the amorphous silicon layer 45' is formed over the gate bus line 11 and the auxiliary capacitor bus line 13 with the insulating film 43 interposed in between.

As seen from FIGS. 5A–5F, at this stage, the semiconductor active layer (amorphous silicon layer) 45 remains over the entire gate bus line 3 and the entire auxiliary capacitor bus line 9 as well as the gate bus line terminal 11 and the auxiliary capacitor bus line 13.

Thereafter, as shown in FIGS. 6A–6F, a protective film 53 (e.g., a silicon nitride film) is formed at a thickness of about 300 nm by plasma CVD. Then, a photoresist layer (not shown) is formed over the entire substrate surface and then patterned by exposing it using a third mask and developing it. The protective film 53 is etched by using the patterned photoresist layer as an etching mask, whereby a pad window 55 of the data bus line terminal 5, a pad window 57 of the gate bus line terminal 11, and a pad window 57 of the auxiliary capacitor bus line terminal 13 are opened (see FIGS. 6A and 6D). Signals coming from external driver circuits are transmitted to the liquid crystal display via the pad windows 55 and 57. The protective film 53 on the source electrode 17 and the storage capacitor electrode 7 is etched away by using the etching mask at the same time as the windows 55 and 57 are opened, whereby contact holes 21 and 23 are formed in the source electrode 17 and the storage capacitor electrode 7, respectively.

Figures 6A, 6B:
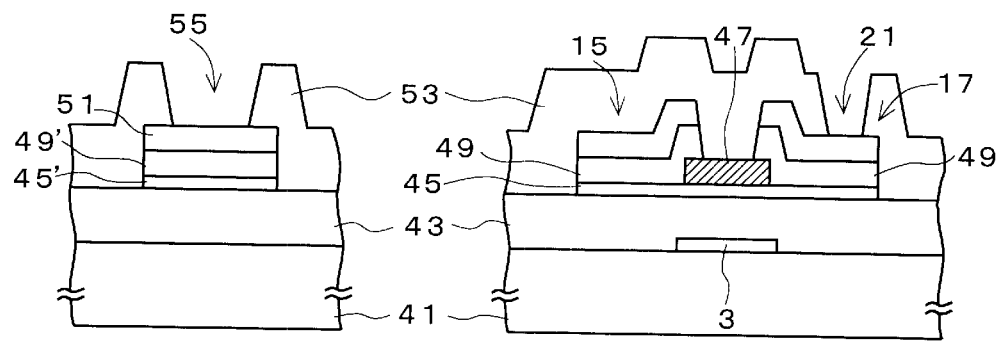
Figures 6C, 6D:
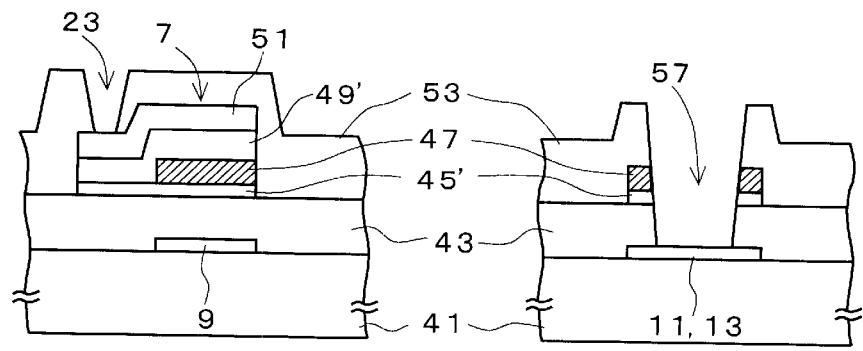
Figures 6E, 6F:
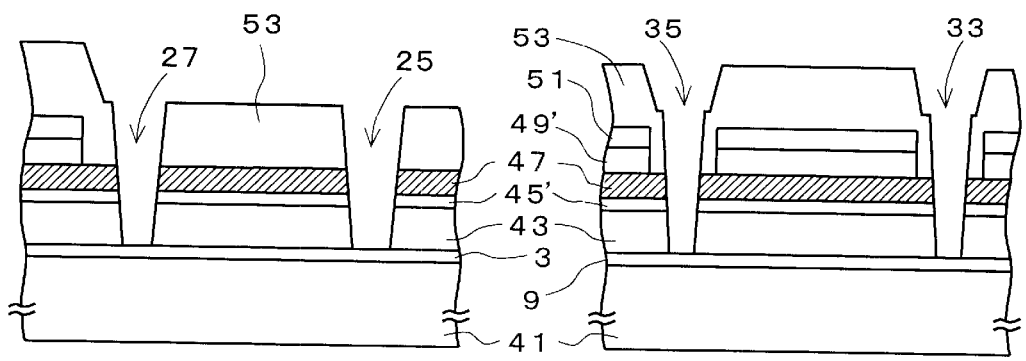

Thereafter, as shown in FIGS. 1 and 6E, the protective film 53 in the regions where device isolation holes 25, 27, 29, and 31 are to be formed is etched away by using the etching mask and then the channel protective film (silicon nitride film) 47, the amorphous silicon layer 45', and the insulating film 43 are etched away until the gate bus line 3 is exposed as the bottom, whereby device isolation holes 25, 27, 29, and 31 are formed. As already described above with reference to FIG. 1, the device isolation holes 25, 27, 29, and 31 are formed as slit-like openings that are wider than the gate bus line 3 and hence traverse it completely. The device isolation holes 25, 27, 29, and 31 cut the semiconductor active layer 45 that extended along the gate bus line 3 and connects pixels, whereby the TFTs of the respective pixels are electrically isolated from each other. Further, over the gate bus line 3, the semiconductor active layer 45 of the TFT of the pixel that is adjacent to the terminal 11 can be isolated electrically from the amorphous silicon layer 45' of the terminal 11.

At the same time, as shown in FIGS. 1 and 6F, the protective film 53 in the regions where device isolation holes 33, 35, 37, and 39 are to be formed is etched away by using the etching mask and then the channel protective film (silicon nitride film) 47, the amorphous silicon layer 45', and the insulating film 43 are etched away until the auxiliary capacitor bus line 9 is exposed as the bottom, whereby device isolation holes 33, 35, 37, and 39 are formed. The device isolation holes 33, 35, 37, and 39 are formed as slit-like openings that are wider than the auxiliary capacitor bus line 9 and hence traverse it completely. The device isolation holes 33, 35, 37, and 39 cut the storage capacitor electrode 7 including the amorphous silicon layer 45' that extended along the auxiliary capacitor bus line 9 and connects pixels, whereby the storage capacitor portions of the respective pixels can be isolated from each other electrically. Further, over the auxiliary capacitor bus line 9, the storage capacitor portion of the pixel that is adjacent to the terminal 13 can be isolated electrically from the terminal 13.

As for the dry etching conditions of the above process, the RF power is 600 W, for example, and the pressure is 8.0 Pa, for example. The etchant is a fluorine-type material that can dissolve the protective film 53, the channel protective film (silicon nitride film) 47, the amorphous silicon layer 45, and the insulating film 43. For example, $SF_6$ (150 sccm) and $O_2$ (250 sccm) are used with an etching time of about 160 seconds.

Subsequently, as shown in FIGS. 7A–7F, a pixel electrode forming layer 59 made of ITO (indium tin oxide), for example, is formed over the entire surface of the transparent glass substrate 41 at a thickness of about 70 nm. Then, the pixel electrode forming layer 59 is patterned by using a fourth mask, whereby a pixel electrode 19 having a prescribed shape as shown in FIG. 1 is formed and prescribed pads are formed in the windows 55 and 57 of the respective terminals (see FIGS. 7A and 7D). The pixel electrode 19 is electrically connected to the source electrode 17 and the storage capacitor electrode 7 via the contact holes 21 and 23, respectively (see FIGS. 7B and 7C). An array substrate of a vertical electric field type liquid crystal display as shown in FIG. 1 according to this embodiment is completed by executing the above process.

As described above, the manufacturing method of a liquid crystal display according to this embodiment can decrease the number of masks that are necessary to produce an array substrate in manufacture of a vertical electric field type liquid crystal display by one from five (conventional case) to four, thereby reducing the cost of the mask formation. Further, since the number of photolithography processes can be decreased by one, the cost of the device manufacture can be reduced and its throughput can be increased.

Figure 8:
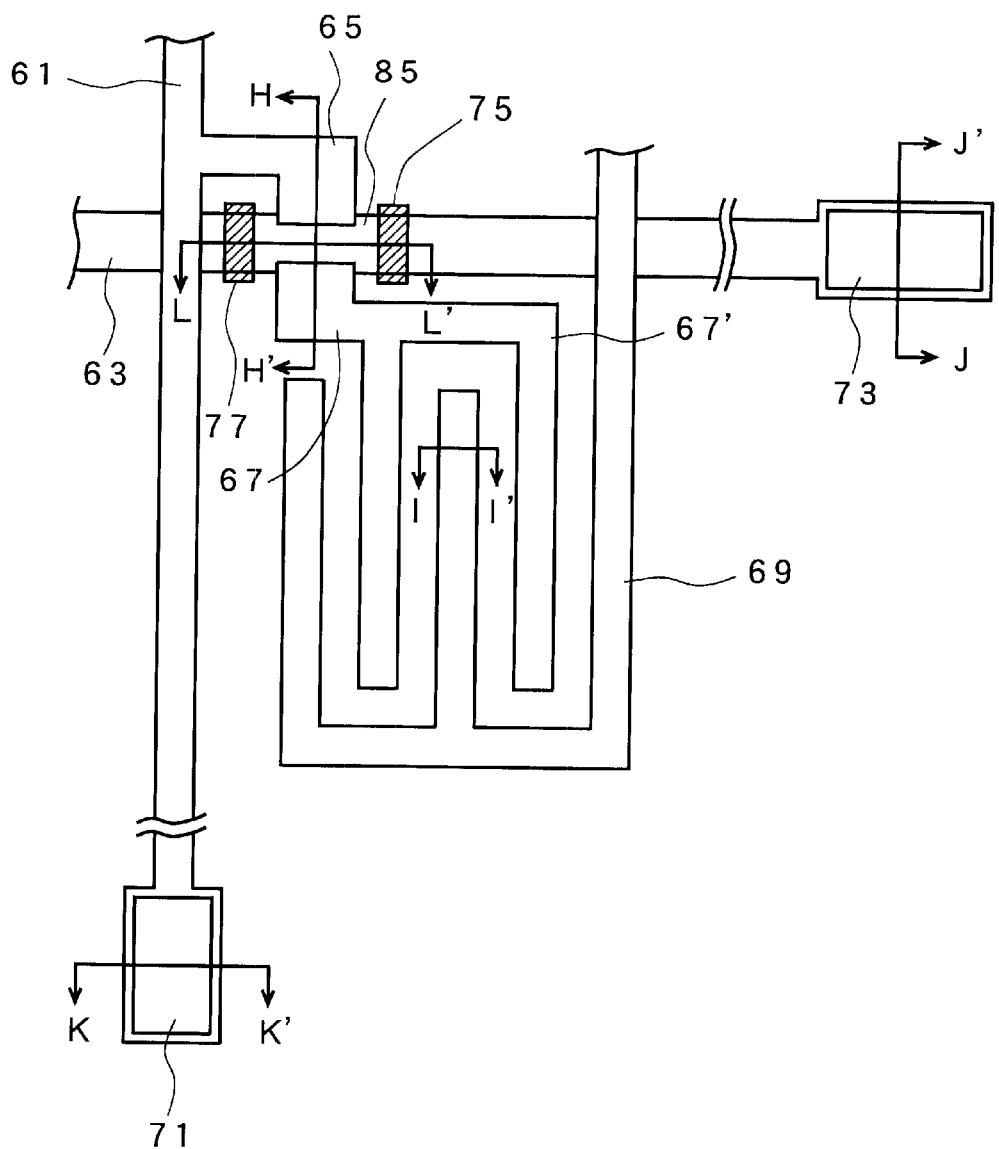
FIG. 8 is a plan view of an array substrate of a horizontal electric field type liquid crystal display panel manufactured by a liquid crystal display manufacturing method according to a second embodiment of the invention.

Next, a manufacturing method of a liquid crystal display according to a second embodiment will be described with reference to FIGS. 8 to 13A–13E. This embodiment is directed to a manufacturing method of a horizontal electric field type liquid crystal display panel. First, a general structure of a horizontal electric field type liquid crystal display panel manufactured according to this embodiment will be described with reference to FIG. 8. FIG. 8 is a substrate plan view of an array substrate of a horizontal electric field type liquid crystal display panel as viewed from the liquid crystal layer side. FIG. 8 shows a pixel region and respective terminal portions of a gate bus line and a data bus line (their intermediate portions are omitted).

Referring to FIG. 8, a plurality of data bus lines 61 (only one data bus line 61 are shown in FIG. 8) are formed in the substrate so as to extend in the top-bottom direction in FIG. 8. A plurality of gate bus lines 63 (only one gate bus line 63 is shown in FIG. 8) are also formed in the substrate so as to extend in the right-left direction in FIG. 8, that is, so as to be perpendicular to the data bus lines 61. Each of regions that are defined by the data bus lines 61 and the gate bus lines 63 is a pixel region. A TFT is formed in the vicinity of each of the intersecting points of the data bus lines 61 and the gate bus lines 63. A drain electrode 65 of the TFT shown in FIG. 8 branches off the data bus line 61 shown in FIG. 8 and has an end portion that is located over one side portion of a channel protective film 85 that is formed over the gate bus line 63 shown in FIG. 8. The channel protective film 85 is separated the other regions by two device isolation holes 75 and 77 that are formed over the gate bus line 63 on both sides of the drain electrode 65. A source electrode 67 overlaps with the other side portion of the channel protective film 85 and is opposed to the drain electrode 65. With the above structure, the portion of the gate bus line 63 right under the channel protective film 85 functions as a gate electrode of the TFT. Although not shown in FIG. 8, a gate insulating film is formed on the gate bus line 63 and a semiconductor active layer where a channel is to be formed is formed between the gate insulating film and the overlying channel protective film 85.

Each of the two device isolation holes 75 and 77 is a slit-like opening that has such a length as to traverse the gate bus line 63 completely and such a depth that the gate bus line 63 is exposed as the bottom of the opening. Therefore, although the semiconductor layer is formed over and along the gate bus line 63, the semiconductor active layer that is defined by the two device isolation holes 75 and 77 is electrically isolated from the semiconductor active layers of the TFTs of the adjacent pixels. In the TFT structure of FIG. 8, the gate electrode does not branch off the gate bus line 63 and, instead, part of the straight gate bus line 63 is used as the gate electrode. The source electrode 67 winds in the pixel region so as to assume a comb structure whose teeth extend downward in FIG. 8 from the base (pixel electrode 67'). In the pixel region of the substrate, an opposite electrode 69 is formed that has a comb structure whose teeth extend upward in FIG. 8 from the base and interdigitate with the teeth of the pixel electrode 67'.

A data bus line terminal 71 for electrical connection to an external device is provided at one end of the data bus line 61. Similarly, a gate bus line terminal 73 is provided at one end of the gate bus line 63.

Next, a manufacturing method of the liquid crystal display shown in FIG. 8 will be described with reference to FIGS. 9A–9E to 13A–13E. In FIGS. 9A–9E to 13A–13E, the components having the same components in FIG. 8 are given the same reference numerals as the latter. FIGS. 9A, 10A, 11A, 12A, and 13A are sectional views of the data bus line terminal 71 taken along line K–K' in FIG. 8. FIGS. 9B, 10B, 11B, 12B, and 13B are sectional views of the TFT taken along line H—H' in FIG. 8. FIGS. 9C, 10C, 11C, 12C, and 13C are sectional views of the opposite electrode 69 taken along line I–I' in FIG. 8. FIGS. 9D, 10D, 11D, 12D, and 13D are sectional views of the gate bus line terminal 73 taken along line J–J' in FIG. 8. FIGS. 9E, 10E, 11E, 12E, and 13E are sectional views of the TFT taken along line L–L' in FIG. 8 that is parallel with the gate bus line 63.

As shown in FIGS. 9A–9E, a metal layer of about 150 nm in thickness is formed on a transparent glass substrate 79 by sputtering Al and Ti, for example, in this order over the entire surface. Then, patterning is performed by using a first mask, whereby a gate bus line 63 (see FIGS. 9B and 9E) and a gate bus line terminal 73 (see FIG. 9D) are formed. Then, a SiN film, for example, is formed over the entire substrate surface at a thickness of about 400 nm, whereby a gate insulating film 81 (may serve as an interlayer insulating film at certain locations; hereinafter referred to as "gate insulating film" or "insulating film" depending on the location of formation) is formed. Then, an a-Si layer 83', for example, to be used for forming a semiconductor active film 83 is formed over the entire substrate surface at a thickness of about 15 nm by plasma CVD. Further, a SiN film 85', for example, to be used for forming a channel protective film 85 is formed over the entire surface at a thickness of about 120 nm by plasma CVD.

Then, after a photoresist is applied to the entire surface by spin coating or the like, back exposure is performed on the transparent glass substrate 79 with the gate bus line 63 used as a mask. The portions of the resist layer (not shown) in exposed regions are dissolved, whereby resist patterns are formed over the gate bus line 63 and the gate bus line terminal 73 in a self-aligned manner. Dry etching is performed on the silicon nitride film 85' by using the resist patterns (not shown) as an etching mask, whereby a channel protective film 85 (may serve as an interlayer insulating film at certain locations; hereinafter referred to as "channel protective film" or "silicon nitride film") is formed (see FIGS. 10A–10E).

As shown in FIGS. 10A–10E, the channel protective film 85 is formed over the gate bus line 63 and the gate bus line terminal 73. At this stage, the amorphous silicon layer 83' to be used for forming a semiconductor active layer 83 exists over the entire substrate surface.

Then, as shown in FIGS. 11A–11E, an $n^+$a-Si layer 87', for example, to be used for forming an ohmic contact layer 87 is formed over the entire surface of the transparent glass substrate 79 at a thickness of about 30 nm by plasma CVD. Then, a metal (e.g., Cr) layer 89 to be used for forming a drain electrode 65, a source electrode 67, a pixel electrode 67', an opposite electrode 69, and a data bus line 61 is formed at a thickness of about 110–170 nm by sputtering. Examples of the material of the metal layer 89 other than chromium are molybdenum (Mo), tantalum (Ta), titanium (Ti), and aluminum (Al). As a further alternative, the metal layer 89 may be a composite film of those materials, a Ti/Al/Ti composite film, or the like.

Thereafter, a photoresist layer is formed over the entire substrate surface and then patterned by exposing it through a second mask and developing it. Etching is performed on the metal layer 89, the $n^+$a-Si layer 87', and the amorphous silicon layer 83' by using the patterned resist layer (not shown) as an etching mask, whereby a data bus line 61, a data bus line terminal 71, a drain electrode 65, a source electrode 67, a pixel electrode 67', an opposite electrode 69, and a semiconductor active layer 83 are formed as shown in FIGS. 12A–12E. Since the channel protective film 85 serves as an etching stopper in this etching process, the amorphous silicon layer 83' under the channel protective film 85 is left without being etched and a desired semiconductor active layer 83 is formed.

Figure 12A:
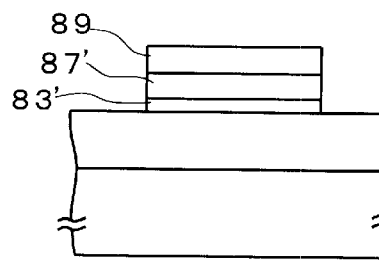
Figure 12B:
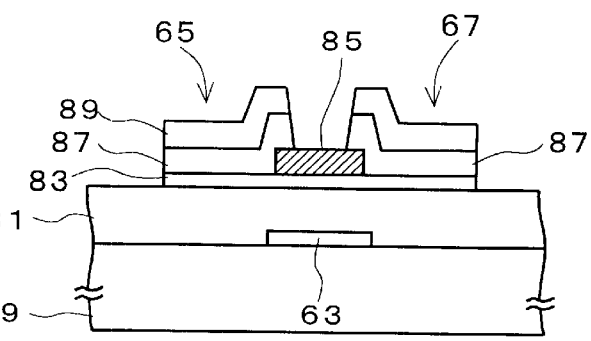
Figure 12C:
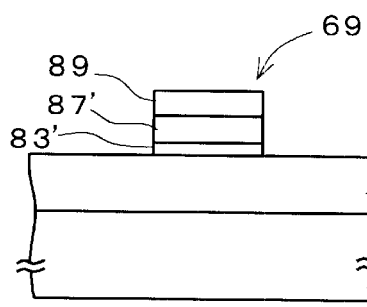

As a result of the execution of the above steps, a structure in which the amorphous silicon layer 83', the $n^+$a-Si layer 87', and the metal layer 89 are laid in this order is formed as the data bus line terminal 71 as shown in FIG. 12A. As shown in FIGS. 12B and 12E, the semiconductor active layer 83 is formed over the gate bus line 63 with the gate insulating film 81 interposed in between and a TFT structure having the channel protective film 85, the drain electrode 65, and the source electrode 67 is formed on the semiconductor active layer 83. Although not shown in FIGS. 12A–12E, the pixel electrode 67' is formed at the same time. In each of the regions of the drain electrode 65, the source electrode 67 and pixel electrode 67', a structure is formed in which the amorphous silicon layer 83', the contact layer 87, and the metal layer 89 is laid in this order. As shown in FIG. 12C, the opposite electrode 69 is formed in which the amorphous silicon layer 83', the $n^+$a-Si layer 87', and the metal layer 89 are laid in this order.

Figure 12D:
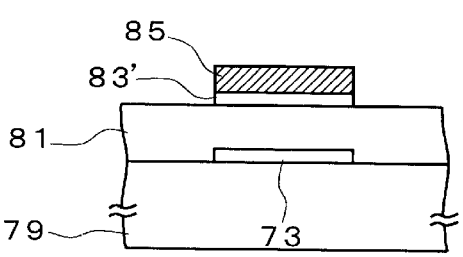
Figure 12E:
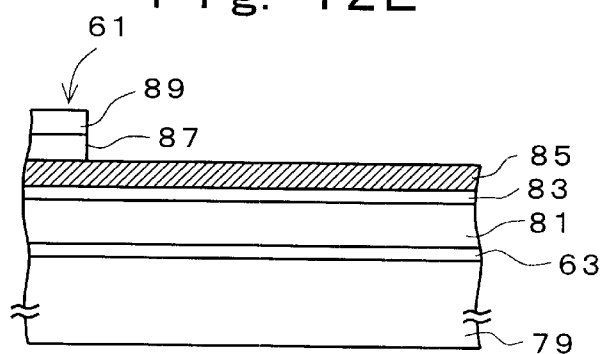
Figure 14:
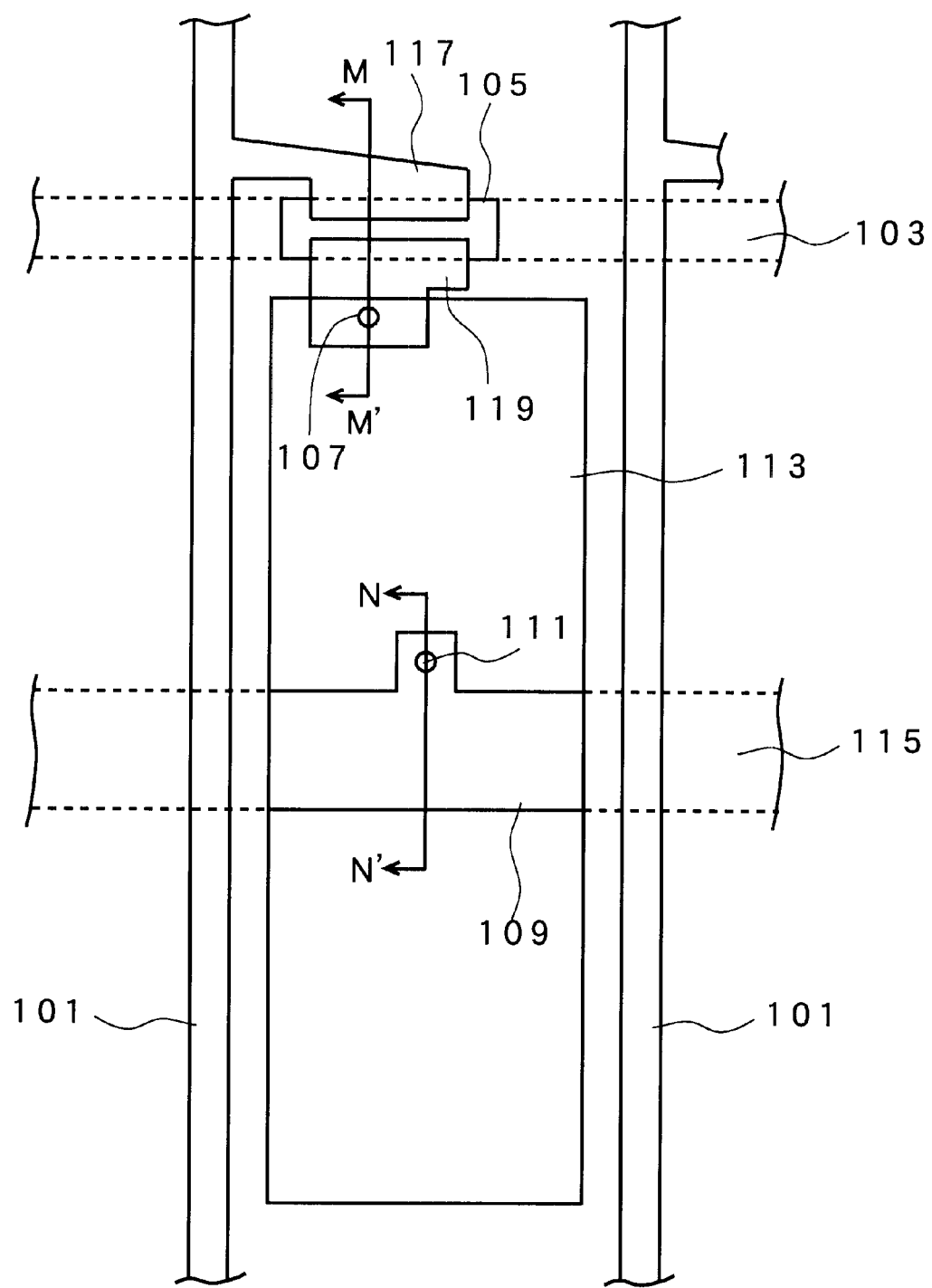
FIG. 14 is a plan view of a conventional vertical electric field type liquid crystal display panel.
Figures 15A, 15B:
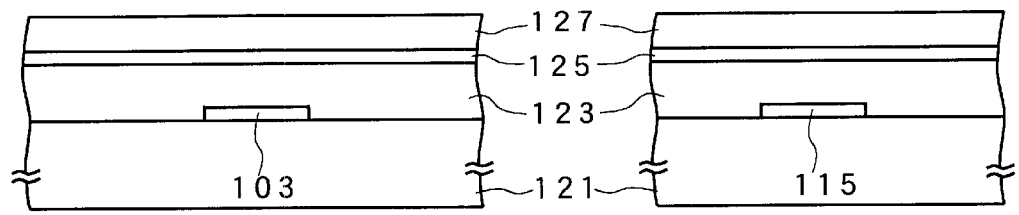
Figures 16A, 16B:
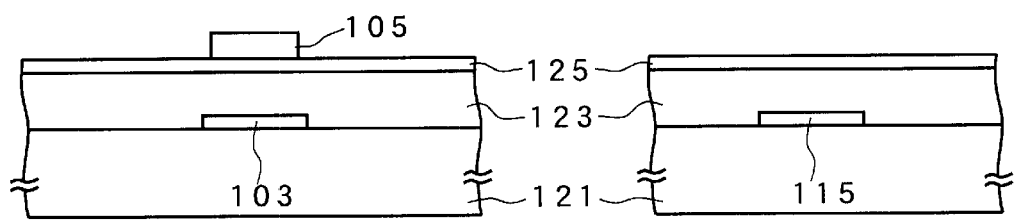
Figures 17A, 17B:
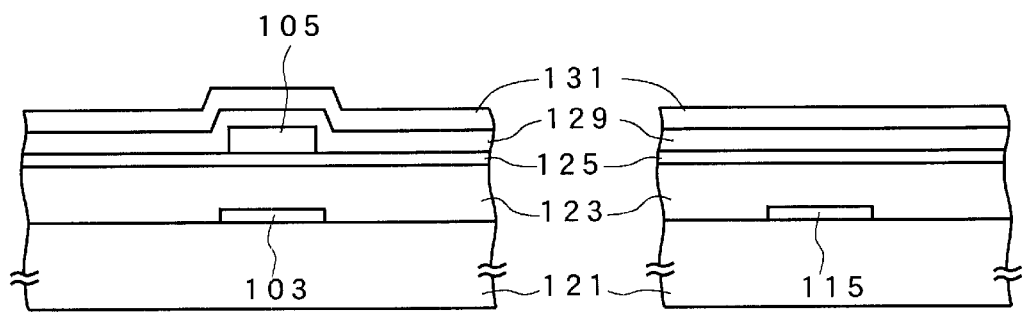
Figure 21:
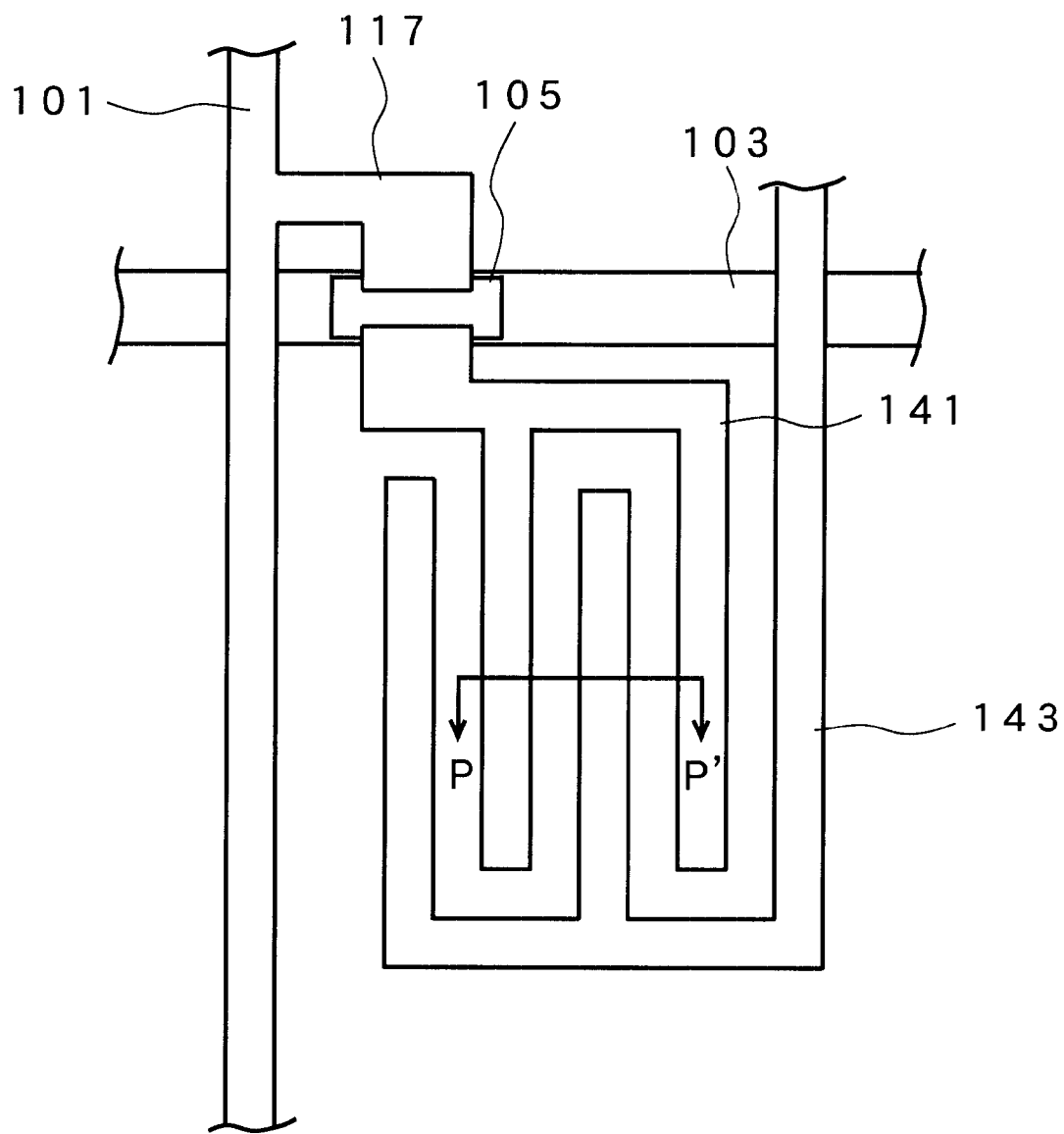
FIG. 21 is a plan view of a conventional horizontal electric field type liquid crystal display panel.
Figure 22:
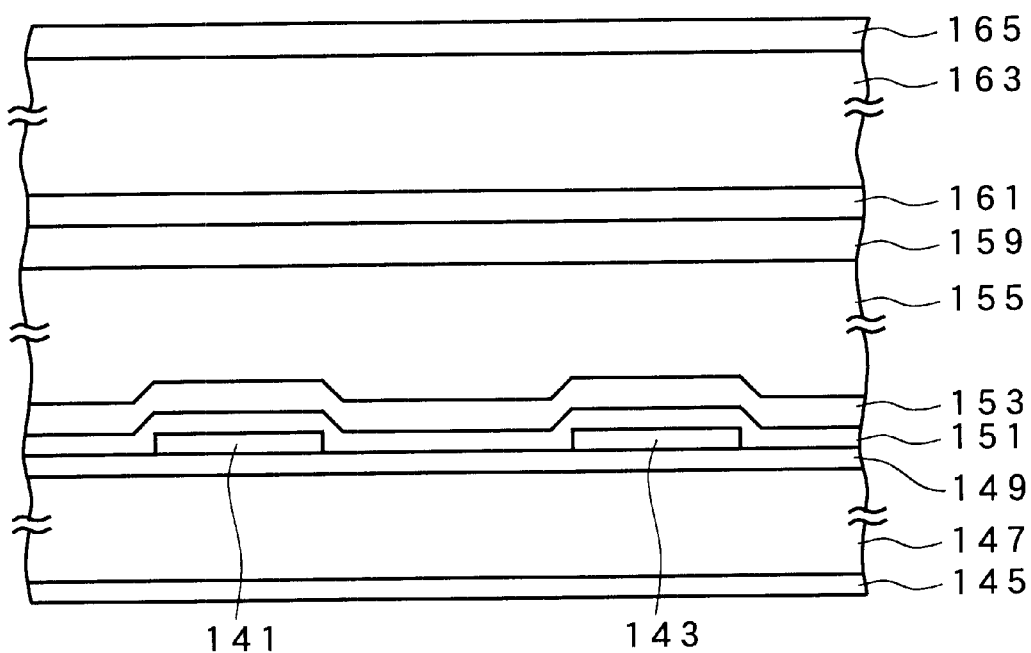
FIG. 22 is a substrate sectional view taken along line P–P' in FIG. 21.

Further, as shown in FIG. 12D, a structure in which the silicon nitride film 85 is laid on the amorphous silicon layer 83' is formed over the gate bus line terminal 73 with the insulating film 81 interposed in between.

As seen from FIGS. 12A–12E, at this stage, the semiconductor active layer (amorphous silicon layer) 83 remains over the entire gate bus line 63 and the terminal 73.

Thereafter, as shown in FIGS. 13A–13E a protective film 91 (e.g., a silicon nitride film) is formed at a thickness of about 300 nm by plasma CVD. Then, a photoresist layer (not shown) is formed over the entire substrate surface and then patterned by exposing it using a third mask and developing it. The protective film 91 is etched by using the patterned photoresist layer as an etching mask, whereby a pad window 95 of the data bus line terminal 71 and a pad window 93 of the gate bus line terminal 73 are opened (see FIGS. 13A and 13D). Signals coming from external driver circuits are transmitted to the liquid crystal display via the pad windows 95 and 93.

At the same time as the above patterning is performed, as shown in FIGS. 8 and 12E, the protective film 91 in the regions where device isolation holes 75 and 77 are to be formed is etched away by using the etching mask and then the channel protective film (silicon nitride film) 85, the amorphous silicon layer 83', and the insulating film 81 are etched away until the gate bus line 63 is exposed as the bottom, whereby device isolation holes 75 and 77 are formed. As already described above with reference to FIG. 8, the device isolation holes 75 and 77 are formed as slit-like openings that are wider than the gate bus line 63 and hence traverse it completely. The device isolation holes 75 and 77 cut the semiconductor active layer 83 that extended along the gate bus line 63 and connected pixels, whereby the TFTs of the respective pixels are electrically isolated from each other. Further, over the gate bus line 63, the semiconductor active layer 83 of the TFT of the pixel that is adjacent to the terminal 73 can be isolated electrically from the amorphous silicon layer 83' of the terminal 73.

As for the dry etching conditions of the above process, the RF power is 600 W, for example, and the pressure is 8.0 Pa, for example. The etchant is a fluorine-type material that can dissolve the protective film 91, the channel protective film (silicon nitride film) 85, the amorphous silicon layer 83, and the insulating film 81. For example, $SF_6$ (150 sccm) and $O_2$ (250 sccm) are used with an etching time of about 160 seconds.

An array substrate of a horizontal electric field type liquid crystal display as shown in FIG. 8 according to this embodiment is completed by executing the above process.

As described above, the manufacturing method of a liquid crystal display according to this embodiment can decrease the number of masks that are necessary to produce an array substrate in manufacture of a horizontal electric field type liquid crystal display by one from four (conventional case) to three, thereby reducing the cost of the mask formation. Further, since the number of photolithography processes can be decreased by one, the cost of the device manufacture can be reduced and its throughput can be increased.

As described above, the invention can decrease the number of masks used in photolithography processes and thereby reduce the manufacturing cost. Further, the invention can simplify the manufacturing process and thereby increase the throughput.

What is claimed is:

1. A manufacturing method of a liquid crystal display, comprising the steps of:

forming a gate insulating film, a semiconductor film, and a first insulating film in this order on a substrate and gate bus lines that are formed on the substrate;

forming channel protective films extending along the respective gate bus lines by performing back exposure using the gate bus lines as a mask and then patterning the first insulating film;

forming, for each pixel region, on the associated channel protective film, a source electrode and a drain electrode that are opposed to each other; and forming, by etching away at least the associated channel protective film and the semiconductor film, two device isolation holes over the associated gate bus line at two locations that are on both sides of the source electrode and the drain electrode.

2. The manufacturing method according to claim 1, further comprising the steps of:

forming storage capacitor lines at the same time as the gate bus lines are formed;

forming protective films extending along the respective storage capacitor lines by performing back exposure using the storage capacitor lines as a mask and then patterning the first insulating film;

forming storage capacitor electrodes over the respective storage capacitor lines with the protective film interposed in between; and forming, by etching away at least the protective film and the semiconductor film, two device isolation holes in the pixel region at two locations that are separated from each other in an extending direction of the associated storage capacitor line, whereby a storage capacitor portion is formed between the two device isolation holes so as to be isolated electrically from the other pixel regions.

3. The manufacturing method according to claim 2, further comprising the step of forming device isolation holes in the vicinity of terminal portions of the respective gate bus lines or terminal portions of the respective storage capacitor lines.

* * * * *